US005086686A

United States Patent [19]

Misawa et al.

[11] Patent Number: 5,086,686

[45] Date of Patent: Feb. 11, 1992

[54] KEYBOARD INSTRUMENT

[75] Inventors: Yoichi Misawa; Toshiyuki Suzuki, both of Hamamatsu, Japan

[73] Assignee: Yamaha Corporation, Hamamatsu, Japan

[21] Appl. No.: 634,712

[22] Filed: Dec. 27, 1990

Related U.S. Application Data

[62] Division of Ser. No. 366,748, Jun. 15, 1989.

[30] Foreign Application Priority Data

Jun. 21, 1988 [JP] Japan ............................... 63-151289
Jun. 21, 1988 [JP] Japan ............................... 63-151290
Jun. 21, 1988 [JP] Japan ............................... 63-151291
Jun. 22, 1988 [JP] Japan ............................... 63-155763

[51] Int. Cl.[5] .......................... G10H 1/00; H05K 5/00

[52] U.S. Cl. ................................ 84/718; 84/DIG. 1; 181/144; 181/154; 381/118

[58] Field of Search ................ 84/718, 719, 743, 744, 84/644, 670, DIG. 1; 181/144, 154; 381/118

[56] References Cited

U.S. PATENT DOCUMENTS 3,064,515 11/1962 Markowitz ................ 84/DIG. 1 X
3,643,000 2/1972 Andersen .................. 84/DIG. 1 X
3,718,747 2/1973 Martin et al. ............. 84/DIG. 1 X
4,058,045 11/1977 Jennings et al. ........... 84/DIG. 1 X
4,133,975 1/1979 Barker, III ...................... 181/144 X
4,206,830 6/1980 Sohma et al. .................. 181/154 X
4,329,902 5/1982 Love .......................... 84/DIG. 1 X
4,365,113 12/1982 Soma et al. ..................... 181/144 X
4,413,544 11/1983 Sauvey ...................... 84/DIG. 1 X
4,601,361 7/1982 Nakada .......................... 181/144 X

*Primary Examiner*—W. B. Perkey
*Attorney, Agent, or Firm*—Spensley Horn Jubas & Lubitz

[57] ABSTRACT

Keyboard instruments incorporating sound systems for generating musical tones are disclosed. In a first keyboard instrument, speakers are mounted near a keyboard, and are arranged upright to be directed to the keyboard on the front side, thereby allowing a performer to clearly grasp the sound quality of performance tones. In a second keyboard instrument, which comprises a Helmholtz resonator consisting of a resonance port and a cabinet, an electro-acoustic transducer mounted on the outer surface of the cabinet and a driver for driving the transducer so as to cancel an air counteraction from the resonator, the size of a sound system is reduced, and the frequency characteristics, especially the low-frequency reproduction characteristics of the sound system are improved.

1 Claim, 11 Drawing Sheets

KEYBOARD INSTRUMENT

This is a division of application Ser. No. 07/366,748 filed on June 15, 1989.

BACKGROUND OF THE INVENTION

2. Field of the Invention

The present invention relates to a keyboard instrument incorporating a sound system for generating musical tones and, more particularly, to an electric or electronic keyboard instrument designed to reduce a sound system in size and improve sound quality or frequency characteristics.

2. Description of the Prior Art

In keyboard instruments, design, frequency characteristics, operability, and the like are very important factors.

In conventional electric or electronic keyboard instruments incorporating speakers, regarding the design, in order to satisfy a demand for a low-profile keyboard instrument, a speaker unit is arranged at a rear portion of a keyboard section. These speaker units are fixed so that their sound radiating directions (axial direction of a diaphragm) are directed to various directions. In a conventional instrument, a slit (tone escape) is formed in the upper surface of an instrument main body case, and the diaphragm of the speaker is arranged to oppose the slit in a substantially horizontal state.

In another electric or electronic keyboard instrument, a speaker is arranged to generate musical sounds toward the rear portion of the main body case. That is, a tone escape is arranged to be open to a side opposite to a performer.

With such a conventional arrangement of a speaker, however, it is difficult for a performer to directly grasp the sound quality of generated tones. Conventionally, the performer grasps performance sounds from sounds reflected by the wall of the rear portion of the instrument main body. In addition, peripheral units such as an MIDI unit cannot be mounted on, e.g., the main body case.

Regarding the frequency characteristics of such a keyboard instrument, for example, an 88-key piano has a lowest bass tone ($A_0$) of 27.5 Hz, and the frequency of a fundamental wave of a bass drum during automatic rhythm performance is about 30 Hz. These ultra low bass tones pose no problem to the performer in monitoring (grasping) a normal performance, even though a fundamental wave itself is not produced enough. This is because if harmonic waves are reproduced, the bass tones are compensated in audible levels. However, for example, in the bass drum, if a fundamental wave of about 30 Hz is slightly output at a level exceeding an audible sound pressure limit, and a harmonic overtone of 50 to 60 Hz is sufficiently output, the generated tone is felt as a heavy bass tone by the performer. In contrast to this, if a sound system having of lowest reproduction frequency of about 70 Hz pr more is used, generated tones become less richer in low frequency region, thus exhibiting a great difference in sound quality.

Many recent keyboard instruments employ a PCM sound source as a sound source. For this reason, if input signals to the sound system are directly reproduced, the sound quality of reproduced tones is very high. In order to reproduce musical tones with high fidelity, a strong demand has arisen for a sound system with improved fidelity. The reproduction characteristics of a sound system are mostly determined by the reproduction characteristics of a speaker system.

A sound system incorporated in conventional keyboard instruments comprises a closed or phase-inversion (bass-reflex) type speaker system and a power amplifier, having a substantially zero output impedance, for constant-voltage driving the speaker system. In this case, the lowest reproduction frequency of the speaker system is mainly determined by the volume of a cabinet (e.g., a main body case) and the characteristics ($f_0$, $Q_0$, and the like) of a speaker unit used in the system. That is, in the conventional keyboard instruments, if musical tones having lower frequencies are to be produced, a cabinet having a larger volume is required, resulting in considerable limitation in design. In addition, performance may be interfered depending on an arrangement of the cabinet, and other problems are posed in terms of operation. FIG. 16 shows an outer appearance of a keyboard instrument designed by integrally forming a rear frame 21 and a cabinet 7. Referring to FIG. 16, reference symbols 9*a* and 9*b* respectively denote bass-reflex ports (resonance ports).

SUMMARY OF THE INVENTION

The present invention has been made in consideration of the problems posed in the above-described conventional keyboard instruments, and has at its first object to provide a keyboard instrument which allows a performer to directly and clearly grasp performance sounds and which has a low profile and allows peripheral units to be arranged on the upper surface of an instrument case.

It is a second object of the present invention to provide a keyboard instrument which can reduce the size of a sound system, especially the size of a cabinet constituting a speaker system, without impairing frequency characteristics, especially low-frequency characteristics, to improve flexibility in design and operability, or which can improve low-frequency characteristics without increasing the cabinet size.

According to a first aspect of the present invention, there is provided a keyboard instrument comprising a box-like main body case, a keyboard arranged on the front side of the main body case, a tone escape formed in the main body case so as to be open to the front side thereof, and a speaker unit which is arranged upright in the case on the rear side of the keyboard while the axis of the diaphragm of the speaker unit is directed to the tone escape, wherein the speaker assembly includes a large-diameter speaker unit and a small-diameter speaker unit, the inclination of the large-diameter speaker unit being smaller than that of the small-diameter speaker unit.

According to the keyboard instrument of the first aspect, desired musical tones are generated by a musical tone generating section through the speaker assembly upon keyboard performance or various switch operations. More specifically, bass tones are generated from the large-diameter speaker unit, whereas treble tones are generated from the small-diameter speaker unit.

These musical tones are generated by vibrating the diaphragms of the respective speaker units. In this case, the axes of the diaphragms of the speakers of the speaker units are directed to the tone escape. The tone escape is open toward the front side of the main body case. As a result, performance sounds directly reach a performer, and hence the performer can clearly hear them.

In addition, peripheral units can be mounted on the upper surface of the main body case. Further, the profile of the main body case can be decreased since the large-diameter speaker unit is inclined more than the small-diameter speaker unit.

According to a second aspect of the present invention, there is provided a keyboard instrument characterized by incorporating a sound system comprising a speaker system having a resonance port, and a driving means. The speaker system is similar in shape to a bass-reflex type speaker system, and has an electro-acoustic transducer arranged on the outer wall of a cabinet having a resonance port, which constitutes a Helmholtz resonator. The transducer drives the Helmholtz resonator on the inner surface side of its vibrating body and directly radiates a sound on the outer surface side of the vibrating body. The driving means drives the transducer so as to cancel an air counteraction from the Helmholtz resonator to the vibrating body.

According to the second aspect, the speaker system comprises a Helmholtz resonator similar to a bassreflex type speaker system. Therefore, a sound is directly radiated from the vibrating body of the electro-acoustic transducer, and at the same time, a sound is also radiated from the Helmholtz resonator driven by the vibrating body. The frequency characteristics of an output sound pressure of the speaker system are equivalent to those obtained by mixing a direct radiation sound from the vibrating body of the electro-acoustic transducer with a resonance sound from the resonator. For this reason, the low-frequency characteristics of this speaker system can be improved compared with those of a closed type speaker system for radiating only a direct radiation sound by the extent of the resonance sound.

In the second aspect, a driving means for the electro-acoustic transducer drives the transducer so as to cancel an air counteraction from the resonator side during a drive period of the Helmholtz resonator. As such a driving means, a known circuit may be employed, e.g., a negative impedance generating circuit for equivalently generating a negative impedance component ($-Z_0$) in an output impedance or a motional feedback (MFB) circuit for detecting a motional signal corresponding to movement of the vibrating body by a certain method and negatively feeding back the detected signal to the input side.

If the electro-acoustic transducer is driven to cancel a counteraction to the vibrating body of the transducer in this manner, when, for example, an air counteraction is completely canceled, the transducer is driven in a so-called dead state wherein the transducer is sufficiently damped to be free from the influences of the air counteraction from the resonator side, i.e., the cabinet side. For this reason, the frequency characteristics of a direct radiation sound are not influenced by the volume of the space at the back of the transducer. Hence, the volume of the cabinet can be minimized as long as no inconvenience occurs as a cavity of the Helmholtz resonator and a casing of the transducer. When viewed from the Helmholtz resonator side, driving the transducer to cancel an air counteraction from the resonator side during a drive period of the resonator means that the vibrating body of the transducer serves as an equivalent wall, i.e., part of a resonator inner wall which cannot be driven by the resonator side. Therefore, the Q value of the Helmholtz resonator is not influenced by the characteristics of the transducer. Even if the resonance frequency based on the resonance port and the cabinet is decreased, a sufficient Q value can be ensured. For this reason, even if a cabinet is reduced in size, a heavy bass tone (resonance tone) can be generated from the Helmholtz resonator.

According to the sound system obtained by combining the speaker system having a resonance port of the present invention and the driving means for driving the transducer of the speaker system so as to cancel an air counteraction from the resonator side during a drive period of the Helmholtz resonator, the volume of the cabinet can be reduced compared with a case wherein a conventional bass-reflex type speaker system is constant-voltage driven. In addition, by elongating the resonance port to decrease the resonance frequency of the resonator, lower bass tones can be reproduced.

As described above, according to the second aspect of the present invention, the cabinet can be reduced in volume and profile.

As the profile of the cabinet is decreased and the ratio of a maximum length, width or height to a minimum length, width or height is increased, characteristics as a duct are enhanced As a result, duct resonance tones having wavelengths corresponding to ½, 1, . . . of the maximum size are generated, and their levels and frequencies become noise or distorted components which cannot be neglected.

According to a third aspect of the present invention, at least part of the inner wall of the cabinet is constituted by a damping material for preventing duct resonance. With this arrangement, generation of noise or distorted components due to duct resonance can be prevented.

If the resonance frequency of the Helmholtz resonator is decreased and the Q value is increased to reproduce lower bass tones in the arrangement of the second aspect, the reproduction frequency characteristics drift. This frequency drift can be compensated by increasing/decreasing an input signal voltage, especially boosting a signal component with a low sound pressure. However, in consideration of a case wherein a given key may be kept depressed, the maximum output of a sound system in a keyboard instrument, especially a driving means must be considered in terms of continuous rating. In this case, the driving means requires a capacity several times larger than that of a normal audio amplifier whose maximum output can be set in terms of instant or intermittent rating. As described above, such a driving means (amplifier) is used to drive the transducer so as to cancel an air counteraction from the resonator side, and is basically required to have a relatively large capacity. Therefore, it is difficult to further increase the capacity of such a driving means (amplifier) to compensate (boost) the abovedescribed frequency drift.

In contrast to this, in a low frequency range below several tens of Hz, since a wavelength becomes several meters or more, a sound image is basically not clear, and the position of a sound source is not much of a problem.

According to a fourth aspect of the present invention, a plurality sets of sound systems each of which is identical with the above sound system are arranged, and the Helmholtz resonators of the respective sound systems are set to have different resonance frequencies. With this arrangement, the drift of sound pressure characteristics obtained by mixing sounds radiated from speaker systems of the respective sound systems is decreased because resonance tones from the respective Helmholtz resonator compensate for each other. As a result, the boost amount of the driving means is decreased, and the maximum output of the driving means can be decreased.

DETAILED DESCRIPTION OF THE PREFERRED EMBODIMENTS

Embodiments of the present invention will be described below with reference to the accompanying drawings.

(First Embodiment)

Figure 1:
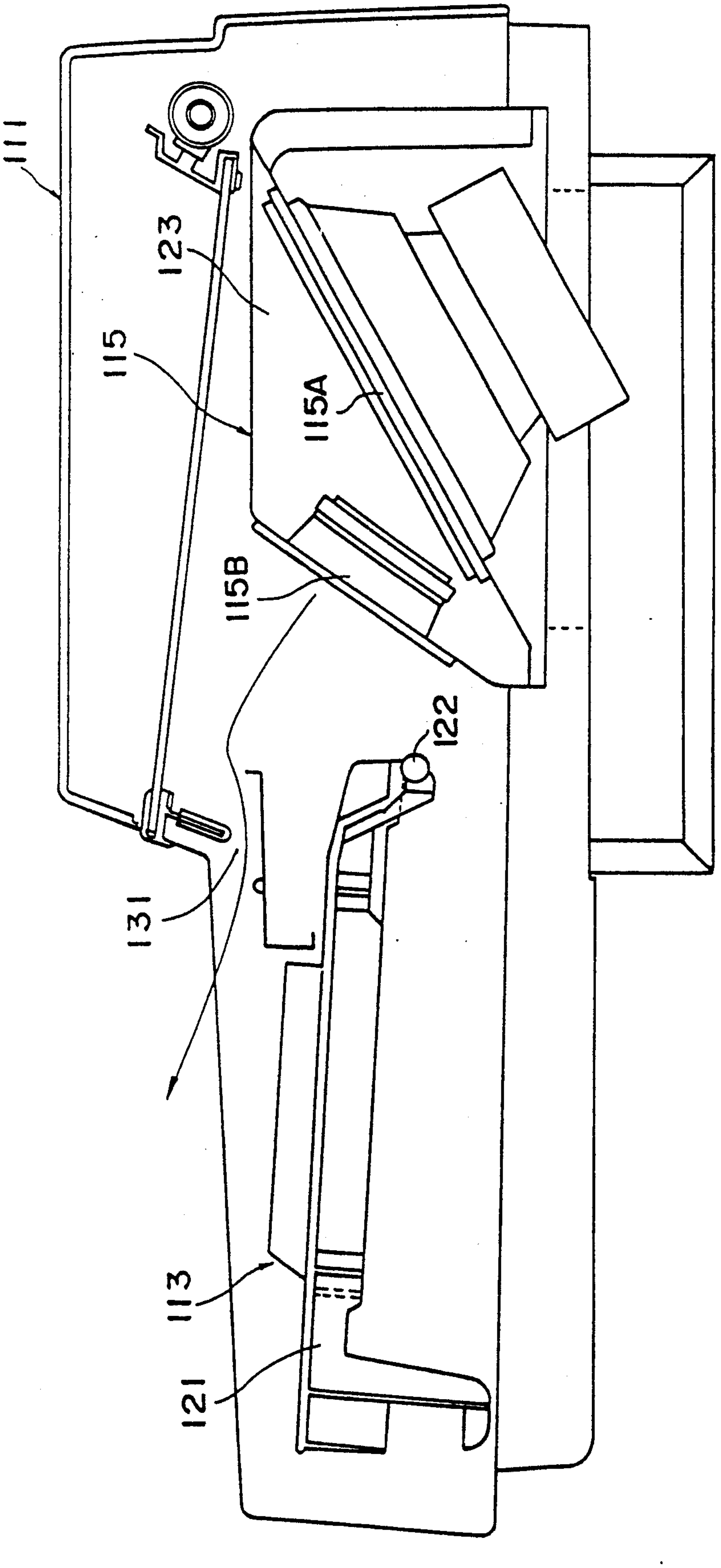
FIG. 1 is a side view showing an arrangement of a keyboard instrument according to a first embodiment of the present invention.
Figure 2:
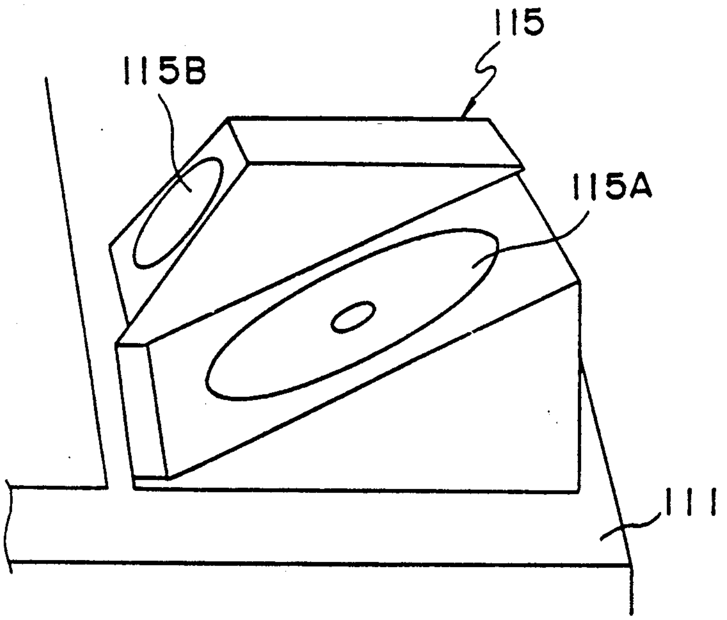
FIG. 2 is a perspective view of a speaker unit according to the first embodiment.

FIGS. 1 and 2 show a keyboard instrument according to a first embodiment of the present invention.

As shown in FIGS. 1 and 2, an electronic keyboard instrument comprises a box type main body case 111. A keyboard 113 and a speaker assembly 115 are arranged in the main body case 111. The keyboard 113 is arranged on the front side of the main body case 111 so as to be vertically swingable. A tone escape 131 is open to an upper portion on the rear side of the keyboard 113.

The keyboard 113 is constituted by a plurality of aligned keys 121. The rear end of each key 121 is swingably supported by a pin 122 as a fulcrum. Switches for detecting depression of these keys 121 and switches for detecting depression strength are arranged around the keys 121.

A speaker unit 115A for bass tones and a speaker unit 115B for treble tones are respectively arranged on the rear side of the keyboard 113 of the main body case 111. These speaker units 115A and 115B are respectively arranged upright in the main body case 111 so as to form predetermined angles with respect to the horizontal plane, e.g., the lower surface of the main body case 111. Reference numeral 123 denotes a bracket for fixing the speaker units 115A and 115B.

The middle-frequency or low-frequency speaker unit (squawker or woofer) 115A has a larger diameter than the high-frequency speaker unit (tweeter) 115B. The inclination of the speaker unit 115A is smaller than that of the speaker unit 115B (see FIG. 1). The tweeter 115B has a diameter of, for example, 12 cm, whereas the squawker 115A has diameter of, for example, 20 cm.

Both the speaker units 115A and 115B are arranged upright to generate musical tones forward. The axis of a diaphragm of the small-diameter speaker unit 115B is directed to the tone escape 131. The axis of a diaphragm of the large-diameter speaker unit 115A is directed to the case located slightly above the tone escape 131. Note that the tone escape 131 is formed at the front surface of the main body case 111 located at a position above the rear side of the keyboard 113.

In the keyboard instrument having the abovedescribed arrangement, vibrations of the diaphragms of the speaker units 115A and 115B are transmitted to a performer through the tone escape 131. As a result, the performer can directly and clearly discriminate sound quality of performance tones, degradation in sound quality, and the like.

The upper surface of the main body case 111 can be formed to be flat, and a slit such as the tone escape 131 need not be formed in the upper surface. Therefore, a peripheral unit such as an automatic performance unit and the like can be placed on the upper surface. In addition, a music desk can be formed on the upper desk as with the case of the conventional instruments.

Note that the inclinations of the speaker units 115A and 115B can be arbitrarily set.

(Second Embodiment)

Figure 3:
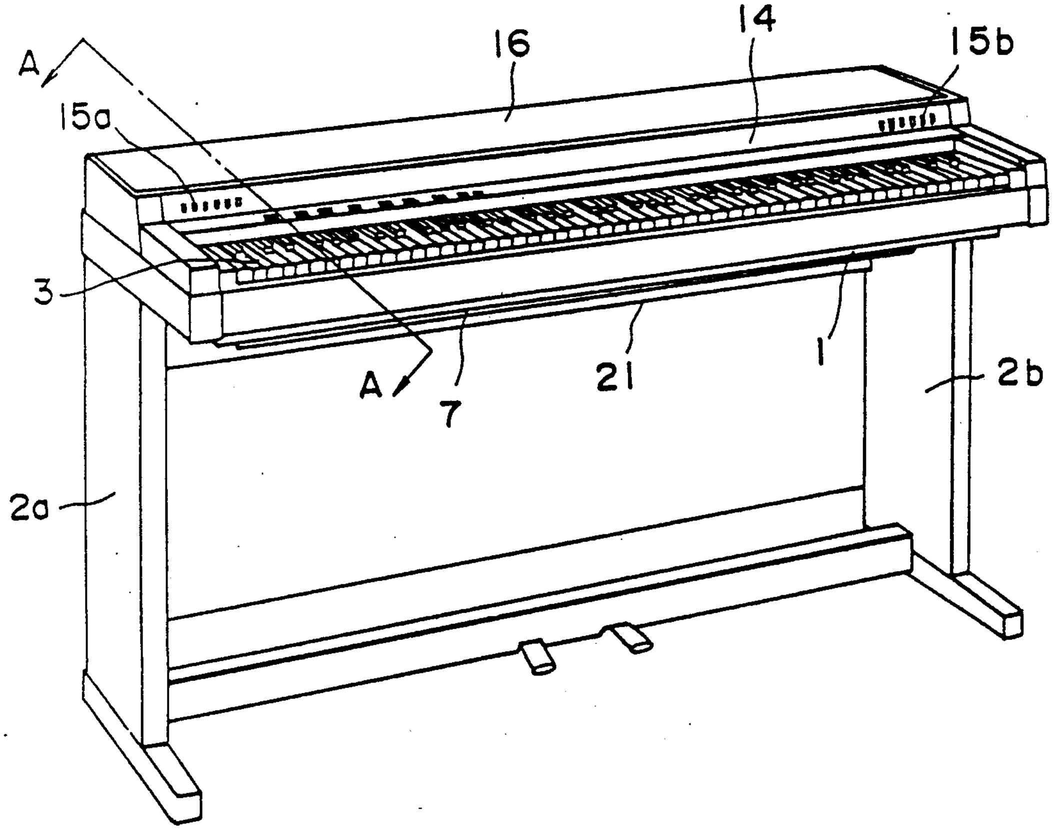
FIG. 3 is a perspective view showing an outer appearance of a keyboard instrument according to a second embodiment of the present invention.

FIG. 3 shows an outer appearance of a keyboard instrument according to a second embodiment of the present invention. This keyboard instrument employs a speaker system with a resonance port as a speaker system constituting a sound system. This speaker system comprises Helmholtz resonators like a conventional bass-reflex type speaker system, and is similar in shape to the bass-reflex type speaker system. However, the volume of the cavity of each Helmholtz resonator of this speaker system is greatly decreased to several liters which is very small in comparison with a volume of 20 to 30 liters of the conventional bass-reflex type speaker system. In addition, each resonance port is elongated to set the resonance frequency of the resonator to be 50 to 60 Hz which is equal to or lower than that of the conventional bass-reflex type speaker system.

Figure 4:
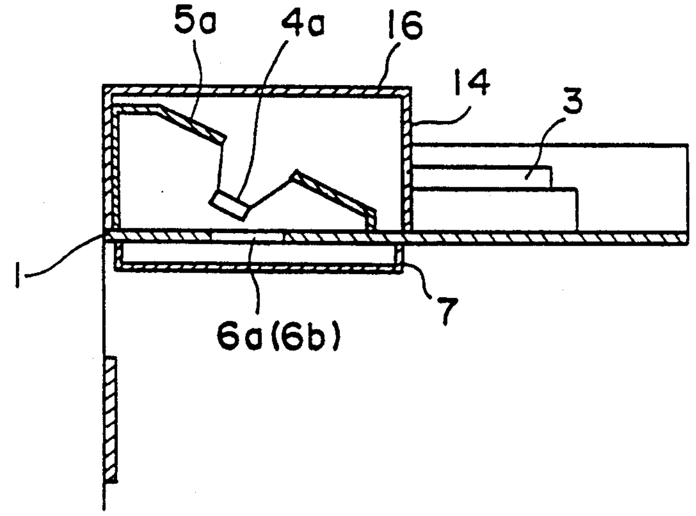
FIG. 4 is a sectional view taken along a line A—A in FIG. 3.
Figure 5:
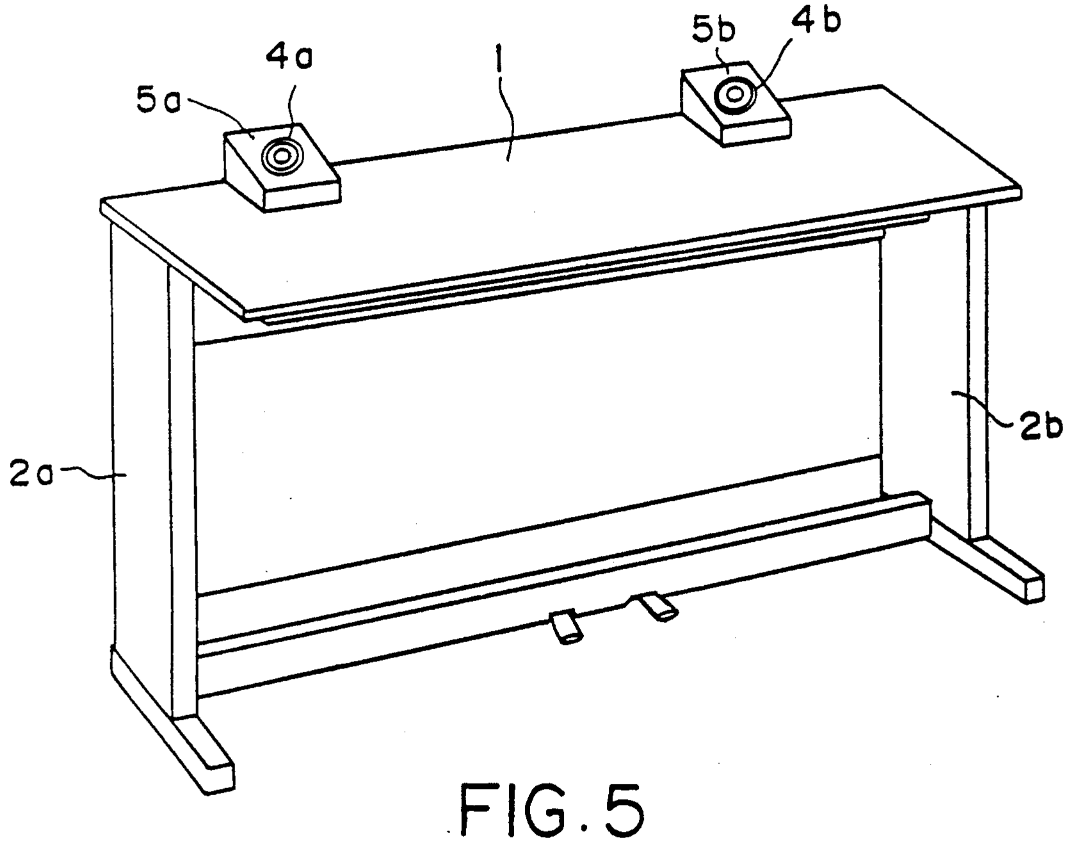
FIG. 5 is a perspective view showing a state wherein exterior components are detached from the keyboard instrument in FIG. 3.

FIG. 4 is a sectional view taken along a line A—A in FIG. 3. FIG. 5 is a perspective view showing a state wherein some exterior components omitted. Referring to FIGS. 3 to 5, a shelf plate 1 is held by two vertical leg portions 2*a* and 2*b* at a predetermined height. A keyboard 3, speaker mounting bases 5*a* and 5*b* for left and right channels, on which speaker units 4*a* and 4*b* are mounted, and electric circuits (not shown) including a sound source and amplifiers for driving the speakers of the respective channels are mounted on the shelf plate 1. In addition, openings 6*a* and 6*b* are formed in the shelf plate 1, and a cabinet 7 is formed under the shelf plate 1. Cavities and resonance ports are formed between the shelf plate 1 and the cabinet 7.

Figure 6B:
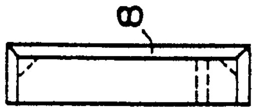
FIGS. 6(*a*) and 6(*b*) are top and right side views, respectively, showing a cabinet in FIG. 3.
Figure 6A:
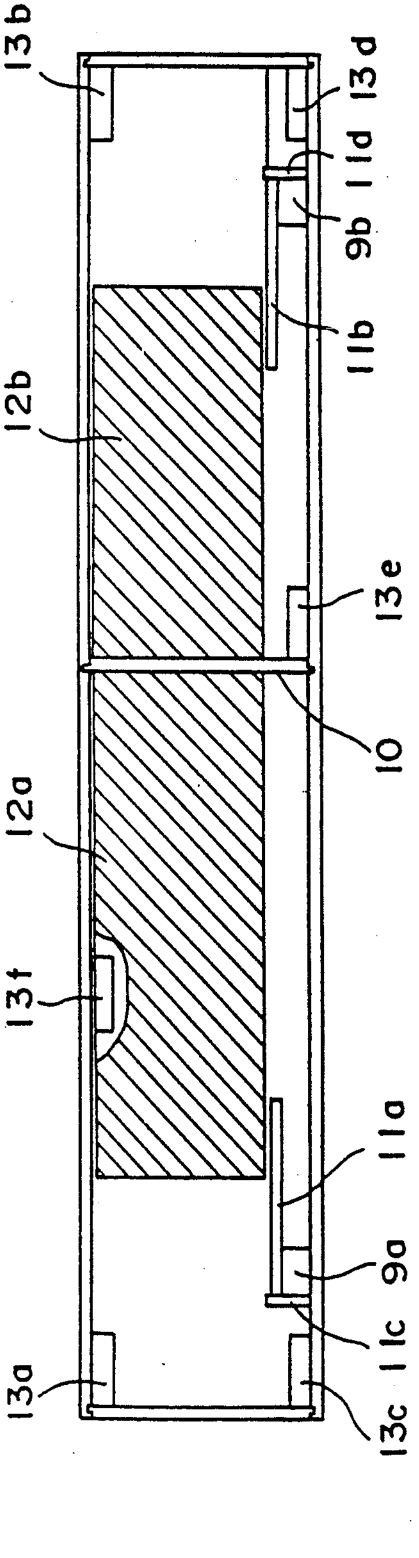

As shown in FIGS. 6(*a*) and 6(*b*), opening ports 9*a* and 9*b* are formed in a bottom plate 8 of the cabinet 7, and the interior of the cabinet 7 is partitioned by an intermediate plate 10 and partition plates 11*a* to 11*d*. Portions partitioned by the opening ports 9*a* and 9*b* and the partition plates 11*a* to 11*d*, which respectively communicate with the ports 9*a* and 9*b*, constitute resonance ports of the Helmholtz resonators when the cabinet 7 is mounted on the shelf plate 1 and the upper portion of the cabinet 7 is closed. Spaces other than the resonance ports constitute cavities when the cabinet 7 is mounted on the shelf plate 1 and the upper portion of the cabinet 7 is closed, and is divided into two cavities for the left and right speaker systems by the intermediate plate 10. When the keyboard instrument is completed, these spaces respectively communicate with spaces formed on the rear sides of the left and right speaker mounting bases 5*a* and 5*b* through the openings 6*a* and 6*b*, and cavities of the Helmholtz resonators are formed by the spaces of the cabinet 7 and the spaces of the speaker mounting bases 5*a* and 5*b*. In this case, the intermediate plate 10 is attached to be slightly shifted from the center toward the right side, so that the volumes of the cavities for the left and right channel speaker systems are respectively set to be about 5.5 and 4.5 liters. In addition, the resonance frequencies of the left and right Helmholtz resonators are set to be different from each other, i.e., 50 and 60 Hz, respectively. If the velocity of sound is represented by c; the sectional area of a resonance port, S; the length of the resonance port, l; and the volume of a cavity, V, a frequency $f_{op}$ of such a Helmholtz resonator can be obtained by the following equation:

$$f_{op}=c(S/lV)^{\frac{1}{2}}/2\pi \quad (1)$$

Felts 12*a* and 12*b* are bonded to the bottom plate 8 of the cabinet 7. In this embodiment, since the height of the cabinet 7 is as 1/10 small as its width, the above space portion strongly exhibits characteristics as a duct. If the wall enclosing this space consists of a rigid material such as a wood, plastic, or metal material, duct resonance tones having wavelengths corresponding to ½, 1, . . . the width of the space portion are generated. In this case, the felts 12*a* and 12*b* are bonded to prevent the duct resonance. In place of the felts 12*a* and 12*b*, other materials having airpermeability and acoustic resistance, e.g., a sponge, an unwoven fabric, and a woven fabric may be used as such a duct resonance preventing means. In addition, the duct resonance preventing means may be constituted by a material having flexibility and viscoelasticity, e.g., rubber. Such flexible, viscoelastic material exhibits a pressure reducing effect substantially equivalent to the air-permeability of the felt and the like due to its flexibility, and serves as a resistor for consuming energy upon flexing due to its viscoelasticity.

The cabinet 7 is reinforced by mounting triangular-prism-like reinforcing members 13*a* to 13*f* at several positions.

Referring to FIGS. 3 to 5, slit-like opening groups 15*a* and 15*b* are formed in a front panel 14 of the keyboard instrument. Direct radiation tones from the speaker units 4*a* and 4*b* obliquely arranged in the instrument are output to the outside through the opening groups 15*a* and 15*b*, respectively. With this arrangement, openings for the direct radiation tones need not be formed in a top plate 16, and hence musical scores, ornaments, and the like can be placed on the top plate 16 without worrying about sound quality.

A frame 21 is formed between the leg portions 2*a* and 2*b* below the cabinet 7 so as to reinforce a structure constituted by the shelf plate 1, the leg portions 2*a* and 2*b*, and the like.

Figure 7:
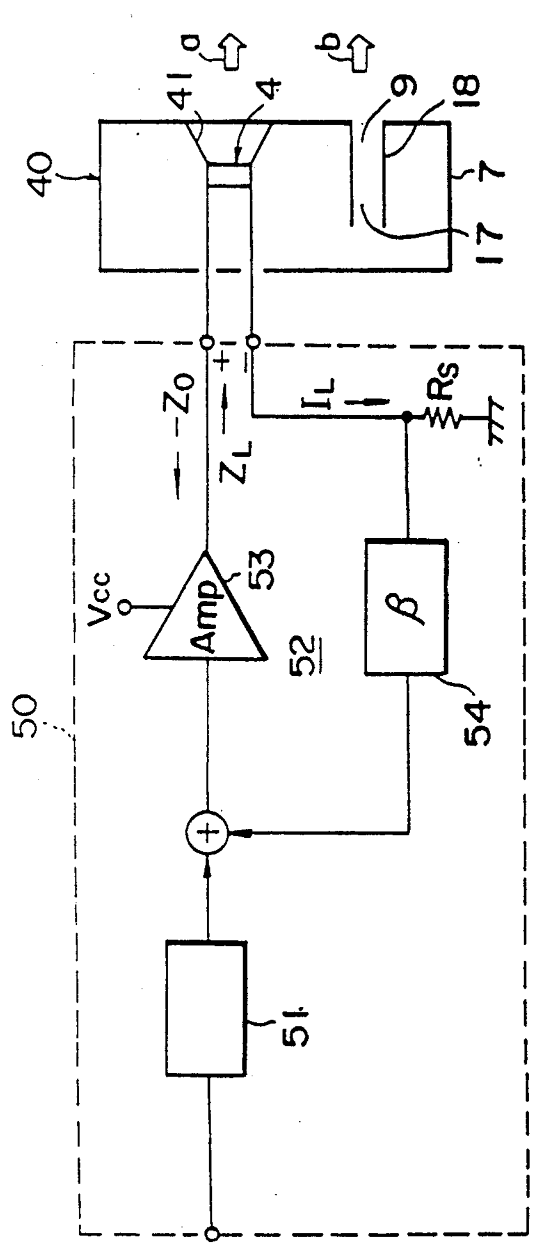
FIG. 7 is a circuit diagram showing a fundamental arrangement of a sound system provided for the keyboard instrument in FIG. 3.

FIG. 7 is a circuit diagram for explaining a fundamental arrangement of an acoustic unit (sound system) incorporated in the keyboard instrument shown in FIG. 3. This acoustic unit includes the speaker system with the resonance port and an amplifier for driving the speaker system. FIGS. 3 and 6 show an arrangement of each speaker system mounted in the instrument.

In the speaker system 40 shown in FIG. 7, a hole is formed in the front surface of a cabinet 7, and a dynamic type electro-acoustic transducer (speaker unit) 4 (4*a*, 4*b*) is mounted in the hole. An resonance port 18 which has a sound path 17 opening to outword of the cabinet 7 through a opening port portion 9 (9*a*, 9*b*) is arranged below the transducer 4. The resonance port 18 and the cabinet 7 form a Helmholtz resonator. In this Helmholtz resonator, an air resonance phenomenon occurs due to an air spring in the cabinet 7 as a closed cavity and an air mass in the sound path 17. A resonance frequency $f_{op}$ is given by the above mentioned formula (1):

$$f_{op}=c(S/lV)^{\frac{1}{2}}/2\pi$$

In FIG. 7, the driver circuit 50 comprises a frequency characteristics compensation circuit 51, negative impedance driver 52 and the like. The negative impedance driver 52 comprises a amplifier 53, resistor $R_S$, and feedback circuit 54.

In the negative impedance driver 52, an output from the amplifier 53 having a gain A is supplied to the speaker unit 4 of the speaker system as a load $Z_L$. A current $I_L$ flowing through the speaker unit 4 is detected by the resistor $R_S$, and the detected current is positively fed back to the amplifier 53 through the feedback circuit 54 having a transmission gain $\beta$. With this arrangement, an output impedance $Z_O$ of the circuit is calculated as:

$$Z_0=R_S(1-A\beta) \quad (2)$$

If $A\beta>1$ is established in this equation, $Z_O$ becomes an open stable type negative resistance.

Figure 8:
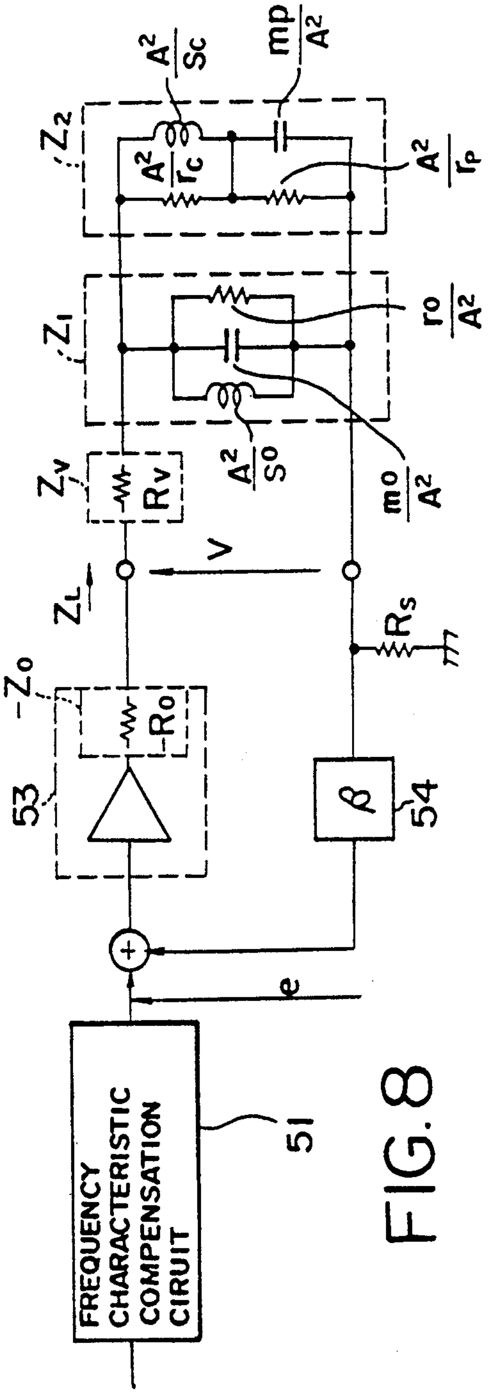
FIG. 8 is an equivalent circuit diagram of the sound system in FIG. 7.

FIG. 8 shows an arrangement of an electric equivalent circuit of the portion comprising the speaker system shown in FIG. 7. In FIG. 8, a parallel resonance circuit $Z_1$ is formed by the equivalent motional impedances which are caused by the motion of the unit vibration system comprising the diaphragm 41 of the speaker unit 4. In the circuit $Z_1$, reference symbol $r_o$ denotes an equivalent resistance of the vibration system; $S_o$, an equivalent stiffness of the vibration system; and $m_o$, an equivalent mass of the vibration system. A series resonance circuit $Z_2$ is formed by an equivalent motional impedance of a Helmholtz resonator constituted by the resonance port and the cavity. In the circuit $Z_2$, reference symbol $r_c$ denotes an equivalent resistance of the cavity of the resonator; $S_c$, an equivalent stiffness of the cavity; $r_p$, an equivalent resistance of the resonance port; and $m_p$, an equivalent mass of the resonance port. In the Figure, reference symbol A denotes a force coefficient. When the speaker unit 4 is a dynamic direct radiation speaker, $A=Bl_v$ where B is the magnetic flux density in a magnetic gap, and $l_v$ is the total length of a voice coil conductor. In the Figure, reference symbol $Z_V$ denotes an internal impedance (non-motional impedance) of the speaker unit 4. When the speaker unit 4 is a dynamic direct radiation speaker, the impedance $Z_V$ mainly comprises a resistance $R_V$ of the voice coil, and includes a small inductance.

The operation of the acoustic apparatus having the arrangement shown in FIGS. 7 and 8 will be described below.

When a drive signal is supplied from the driver circuit 50 having a negative impedance drive function to the speaker unit 4, the speaker unit 4 electromechanically converts this signal to reciprocate its diaphragm 41 forward and backward (to the left and right in FIG. 7). The diaphragm 41 mechano-acoustically converts the reciprocal motion. Since the driver circuit 50 has the negative impedance drive function, the internal impedance of the speaker unit 4 is equivalently reduced (ideally invalidated). Therefore, the speaker unit 4 drives the diaphragm 41 while faithfully responding to the drive signal input to the driver circuit 50, and independently supplies drive energy to the Helmholtz resonator constituted by the resonance port 18 and the cabinet 7. In this case, the front surface side (the right surface side in FIG. 7) of the diaphragm 41 serves as a direct radiator portion for directly radiating acoustic wave to the outward, and the rear surface side (the left surface side in FIG. 7) of the diaphragm 41 serves as a resonator driver portion for driving the Helmholtz resonator constituted by the resonance port 18 and the cabinet 7.

Figure 9:
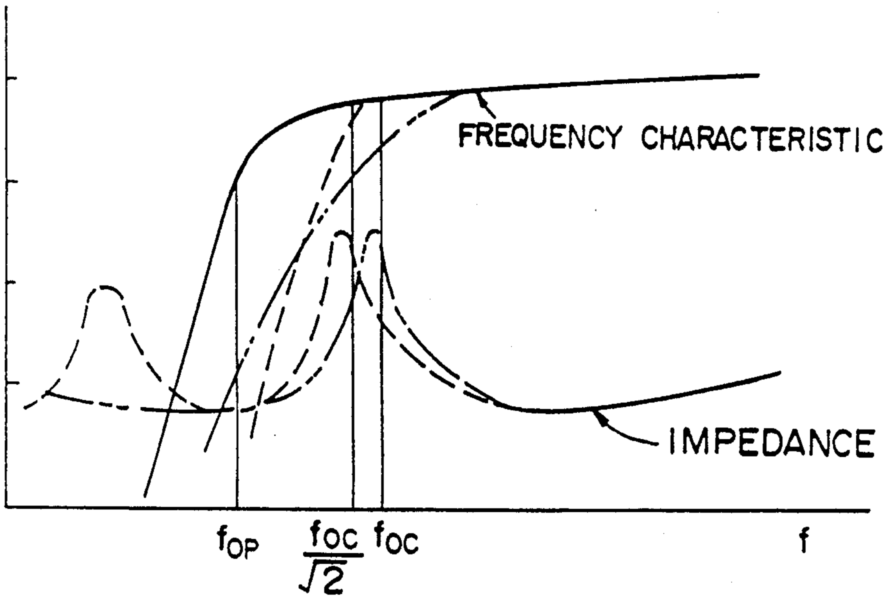
FIG. 9 is a graph showing frequency characteristics of sound pressures of sounds radiated from the sound systems in FIGS. 3 and 7.

For this reason, as indicated by an arrow a in the FIG. 7, an acoustic wave is directly radiated from the diaphragm 41, and air in the cabinet 7 is resonated, so that an acoustic wave having a sufficient sound pressure is resonantly radiated from the resonance radiation portion (the opening portion 9 of the resonance port 18), as indicated by an arrow b in the Figure. By adjusting an air equivalent mass in the resonance port 18 of the Helmholtz resonator, the resonance frequency $f_{op}$ is set to be lower than the Helmholtz resonance frequency $f_{op}$ $(=f_{oc}/\sqrt{2})$ which is a standard setting value as a conventional bass-reflex speaker system (where $f_{oc}$ is the lowest resonance frequency of the speaker unit 4 supposed to be attached to a conventional bass-reflex type cabinet), and by adjusting the equivalent resistance of the resonance port 18, the Q value is set to be an appropriate level, so that a sound pressure of an appropriate level can be obtained from said opening portion of the resonance port 18. By these adjustments and by increasing/decreasing the signal level input to the driver circuit, sound pressure-frequency characteristics shown by, for example, solid lines in FIG. 9 can be obtained. Note that, in FIG. 9, alternate one long and two dashed lines represent a frequency characteristic and a impedance characteristic of conventional closed type speaker system, and dotted lines represent a frequency characteristic and a impedance characteristic of conventional bass-reflex type speaker system, An operation when speaker system utilizing the Helmholtz resonator is driven by a negative impedance will be described below.

Figure 10:
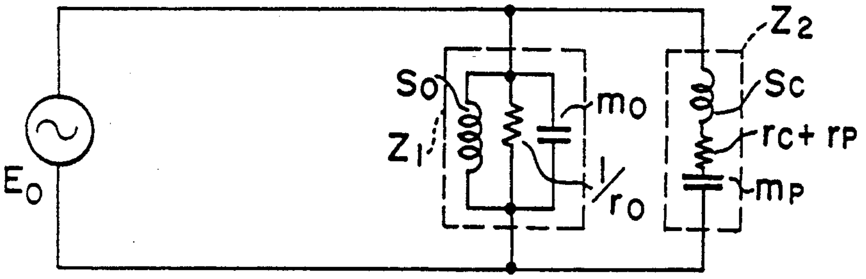
FIG. 10 is an equivalent circuit diagram of the instrument in FIG. 7 when $Z_V - Z_0 = 0$.

FIG. 10 shows an electric equivalent circuit when $Z_V-Z_0=0$ in FIG. 8, i.e., when the internal impedance (non-motional impedance) of a speaker unit 4 is equivalently completely invalidated. In the Figure, equivalent resistances $r_c$ and $r_p$ of a resonance port 18 and a cavity are converted into a resistance seriesconnected to motional impedances $S_c$ and $m_p$ in FIG. 8, and coefficients assigned to the respective elements are omitted.

The equivalent circuit diagram reveals the following facts.

The two ends of the parallel resonance circuit $Z_1$ formed by the equivalent motional impedance of the speaker unit 4 are short-circuited at a zero impedance in an AC manner. Therefore, the parallel resonance circuit $Z_1$ has a Q value of 0, and can no longer serve as a resonance circuit. More specifically, this speaker unit 4 loses the concept of a lowest resonance frequency which is present in a state wherein the speaker unit 4 is merely mounted on the Helmholtz resonator. In the following description, the lowest resonance frequency $f_0$ or equivalent of the speaker unit 4 merely means the essentially invalidated concept. In this manner, since the unit vibration system (parallel resonance circuit) $Z_1$ does not essentially serve as a resonance circuit, the resonance system in this acoustic apparatus is only the Helmholtz resonance system (series resonance circuit) $Z_2$.

Since the speaker unit 4 does not essentially serve as the resonance circuit, it linearly responds to a drive signal input in real time, and faithfully electro-mechanically converts an electrical input signal (drive signal $E_0$), thus displacing the diaphragm 41 without transient responce. That is, a perfect damped state (so-called "speaker dead" state) is achieved. The output sound pressure-frequency characteristics around the lowest resonance frequency $f_0$ or equivalent of this speaker in this state are 6 dB/oct. Contrary to this, characteristics of a normal voltage drive state are 12 dB/oct.

The series resonance circuit $Z_2$ formed by the equivalent motional impedance of the Helmholtz resonator is connected to the drive signal source $E_0$ at a zero impedance. Thus, the circuit $Z_2$ no longer has a mutual dependency with the parallel resonance circuit $Z_1$. Thus, the parallel resonance circuit $Z_1$ and the series resonance circuit $Z_2$ are present independently of each other. Therefore, the volume (in inverse proportion to $S_c$) of the cabinet 7, and the shape and dimension (in proportion to $m_p$) of the resonance port 18 do not adversely influence the direct radiation characteristics of the speaker unit 4. The resonance frequency and the Q value of the Helmholtz resonator are not influenced by the equivalent motional impedance of the speaker unit 4. More specifically, the characteristic values ($f_{op}$, $Q_{op}$) of the Helmholtz resonator and the characteristic values ($f_o$, $Q_o$) of the speaker unit 4 can be independently set. Furthermore, the series resistance of the series resonance circuit $Z_2$ is only $r_c+r_p$, and these resistances are sufficiently small values, as described above. Thus, the Q value of the series resonance circuit $Z_2$, i.e., the Helmholtz resonator can be set to be sufficiently high.

From another point of view, since the unit vibration system does not essentially serve as a resonance system, the diaphragm 41 contituting the unit vibration system is displaced according to a drive signal input $E_0$, and is not influenced by an external force, in particular, an air counteraction caused by the equivalent stiffness $S_c$ of the cabinet. For this reason, the diaphragm 41 equivalently serves as a wall when viewed from the cabinet side, and the presence of the speaker unit 4 when viewed from the Helmholtz resonator is invalidated. Therefore, the resonance frequency $f_{op}$ and the Q value $Q_{op}$ of the Helmholtz resonator do not depend on the non-motional impedance of the speaker unit 4. Even when the resonance frequency is set to be a value so that the Q value is considerably decreased in a conventional drive method, the Q value can be maintained to be a sufficiently large value. The Helmholtz resonance system is present as a virtual speaker which performs acoustic radiation quite independently of the unit vibration system. Although the virtual speaker is realized by a small diameter corresponding to the port diameter, it corresponds to one having a considerably large diameter as an actual speaker in view of its bass sound reproduction power.

The system and apparatus of the present invention described above will be compared with a conventional system wherein a bass-reflex speaker system is driven by an ordinary power amplifier. In the conventional system, as is well known, a plurality of resonance systems, i.e., the unit vibration system $Z_1$ and the Helmholtz resonance system $Z_2$, are present, and the resonance frequencies and the Q values of the resonance systems closely depend on each other. For example, if the resonance port is elongated or its diameter is reduced ($m_p$ is increased) to lower the resonance frequency of the Helmholtz resonance system $Z_2$, the Q value of the unit vibration system $Z_1$ is increased and the Q value of the Helmholtz resonance system $Z_2$ is decreased. If the volume of the cabinet is decreased ($S_c$ is increased), the Q value and the resonance frequency of the unit vibration system $Z_1$ are increased, and the Q value of the Helmholtz resonance system $Z_2$ is further decreased even if the resonance frequency of the Helmholtz resonance system $Z_2$ is kept constant by elongating the port or decreasing its diameter. More specifically, since the output sound pressure-frequency characteristics of the speaker system are closely related to the volume of the cabinet and the dimensions of the port, a high-grade design technique is required to match them. Thus, it is generally not considered that a cabinet (or system) can easily be made compact in size without impairing the frequency characteristics of an output sound pressure, in particular, a bass range characteristics. The relationship between the frequency lower than the resonance frequency and a resonance acoustic radiation power in the Helmholtz resonance system $Z_2$ is decreased at a rate of 12 dB/oct with respect to a decrease in frequency when viewed from the sound pressure level. Thus, when the resonance frequency is set to be extremely lower than that of the basic concept of the bass-reflex speaker system, correction by increasing/decreasing an input signal level is very difficult to achieve. Furthermore, adverse influences on sound quality caused by the high Q value and the adrupt change in phase of the unit vibration system around the lowest resonance frequency cannot be eliminated.

In the driver circuit of this embodiment, as described above, since the speaker system utilizing Helmholtz resonance is driven by a negative impedance, the characteristics, dimensions, and the like of the unit vibration system and the Helmholtz resonance system can be independently set. In addition, even if the resonance frequency of the Helmholtz resonance system is set to be low, the large Q value and the high bass sound reproduction power can be maintained, and the resonator drive power of the unit vibration system can be increased (6 dB/oct). Therefore, nonuniformity of the frequency characteristics can be advantageously corrected by increasing/decreasing an input signal level like in normal sound quality control. For this reason, a cabinet can be rendered compact and speaker system can be made compact in size without impairing a frequency characteristics and a sound quality. In addition, since the resonance frequencies and the Q values of the respective resonance systems may be set in a relatively optional manner when the driver circuit of this embodiment is used, the sound quality can be improved or the acoustic reproduction range, in particular, a bass sound range, can be easily expanded by driving an existing speaker system, as compared with the case wherein the speaker system is driven by a conventional constant-voltage driving system.

In the above description, the case of $Z_V - Z_0 = 0$ has been exemplified. However, in this embodiment, $Z_V - Z_0 > 0$ may be allowed if $-Z_0 < 0$. In this case, the characteristic values and the like of the unit vibration system and the Helmholtz resonance system become intermediate values between the case of $Z_V - Z_0 = 0$ and the case of the conventional constant voltage drive system according to the value of above-mentioned impedance $Z_V - Z_0$. Therefore, by positively utilizing this nature, the Q value of the Helmholtz resonance system can be adjusted by adjusting the negative impedance $-Z_0$ instead of adjusting the port diameter or inserting a mechanical Q damper such as glass wool or felt in the cabinet.

Figure 11A:
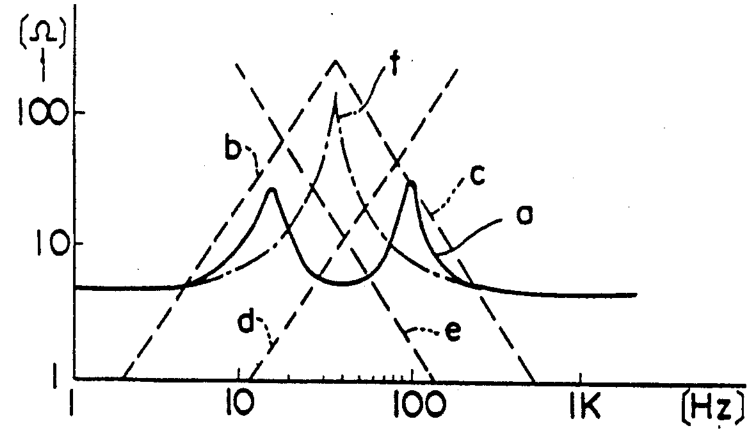
FIGS. 11(*a*), 11(*b*), and 11(*c*) are graphs respectively showing frequency characteristics of the sound system in FIG. 7.
Figure 11B:
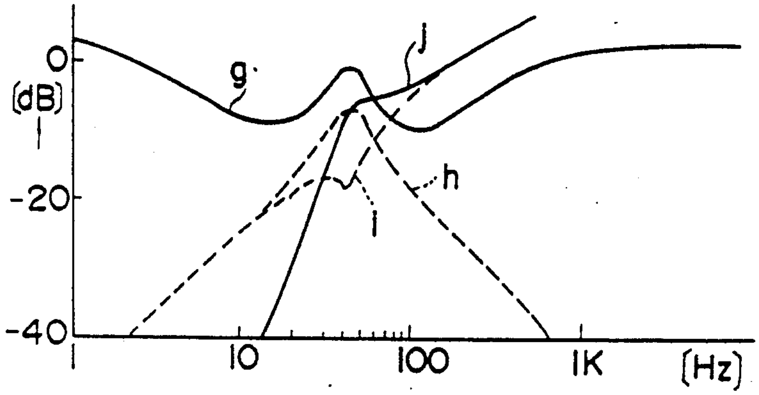
Figure 11C:
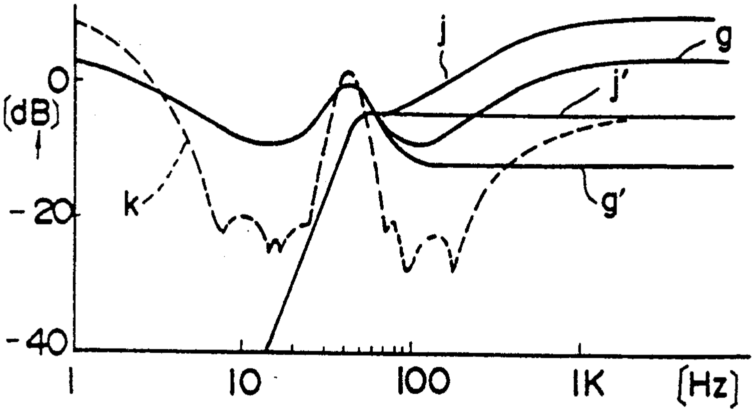

FIGS. 11(*a*), 11(*b*), and 11(*c*) are graphs simulating the electric characteristics of the acoustic unit in FIG. 7 using the speaker system with the resonance port and a driver 50. In this case, the nominal impedance of a speaker unit 4 is set to be 8 Ω; an AC input voltage e of a negative impedance generator 52 of the driver 50, 1 V; and an output impedance $Z_0$, −7 Ω.

Referring to FIG. 11(*a*), a solid curve a represents the frequency characteristic of an impedance $Z_L$ of the speaker system with the resonance port; a broken curve b, the frequency characteristic of an impedance due to an equivalent inductance $A^2/S_o$ of the speaker unit 4; a broken curve c, the frequency characteristic of an impedance due to an equivalent capacitance $m_o/A^2$ of the speaker unit 4; a broken curve d, the frequency characteristic of an impedance due to an equivalent inductance $A^2/S_c$ of the cabinet 7; a broken curve e, the frequency characteristic of an impedance due to an equivalent capacitance $m_p/A^2$ of the cabinet 7; and an alternate long and short dashed curve f, the frequency characteristic of an impedance of a unit resonance system Z1. In the Figure, the resonance frequency of the unit resonance system is set to be a value corresponding to the intersection point between the broken curves b and c, i.e., about 35 Hz, and the resonance frequency of a port resonance system is set to be a value corresponding to an intersection point between the broken curves d and e, i.e., about 40 Hz.

Referring to FIG. 11(*b*), a solid curve g represents an output terminal voltage V of the negative impedance generator 52; a broken curve h, the output sound pressure characteristic of a resonance radiation sound from the port resonance system; a broken curve i, the output sound pressure characteristic of a direct radiation sound from the unit resonance system; and a solid curve j, the synthetic output sound pressure characteristic as the speaker system obtained by mixing the broken curves h and i. The output terminal voltage V is obtained by:

$$V=Z_Le/(Z_L+-Z_0) \quad \ldots (3)$$

Therefore, if $-Z_0$ and $Z_L$ are respectively replaced with pure resistances $-R_0(=-7\Omega)$ and $R_L$, the voltage V is changed as follows: $V=8V$ for $R_L=8\Omega$; $V=4.5$ V for $R_L=9\Omega, \ldots$ FIG. 11(*c*) shows a case wherein a flat output sound pressure characteristic can be obtained at frequencies of 50 Hz or more as indicated by a solid curve j' by increasing/decreasing the input voltage e of the negative impedance generator 52 by using a frequency characteristic compensation circuit 51 of the driver 50 in accordance with a frequency and compensating the output voltage from the generator 52 as indicated by a solid curve g'. Referring to the Figure, a broken curve k represents the output power (Watt) characteristic of an amplifier 53 (i.e., the negative impedance generator 52) when the output sound pressure characteristic is to be made flat.

In the keyboard instrument shown in FIG. 3, the port resonance frequencies of the speaker systems in the acoustic units of left and right channels are set to be different, i.e., 50 and 60 Hz, respectively. With this arrangement, a synthetic frequency characteristic of the left and right speaker systems is shaped like as a sound pressure characteristic having a peak at 50 Hz, which is obtained from the resonance port of the left speaker, is added to an output sound pressure characteristic exhibiting a flat characteristic at frequencies of 60 Hz or more, which is obtained from the right speaker system. As a result, the uniform reproduction range can be widened toward the low-frequency side. If the characteristics of the frequency characteristic compensation circuit 51 are properly set, the low-frequency side of the uniform reproduction range can be widened to 50 Hz by using only the right channel. In this case, however, the output voltage of the amplifier 53 must be increased near the port resonance frequency, as indicated by the broken curve k in FIG. 11(*c*). Referring to FIG. 11(*c*), in order to widen the low-frequency side of the uniform reproduction frequency by 10 Hz, the output power of the amplifier 53 must be increased by 6 dB (four times). Especially in a keyboard instrument, the capacity of the amplifier 53 must be determined in terms of continuous rating in consideration of a case wherein keys are kept depressed. If the nominal output is assumed to be equal, the above-described system requires a power amplifier having an output several times larger than that of an audio amplifier whose output can be determined in terms of an intermittent or instant maximum output. If the output of the power amplifier must be further increased to flatten the frequency characteristic, a load in circuit design is excessively increased. In this embodiment, therefore, the resonance frequency of the left port is set to be 50 Hz which is lower than that of the right port by 10 Hz. Output sound pressures at frequencies around 50 Hz are mainly radiated from the resonance port of the left speaker system so as to reduce the load of the right driver 50. Similarly, sounds at around 60 Hz are mainly radiated from the resonance port of the right speaker system so as to reduce the load of the left driver 50.

In a low-frequency range below several tens Hz, since a wavelength becomes several meters or more, the directivity of sound is weak. Therefore, whether a given sound is radiated from the left or right channel poses little problem That is, even if sounds having different sound pressures are radiated from the left and right speakers as described above, problems such as localization of sound images are scarcely posed.

In this embodiment, since the output sound pressure characteristic of the acoustic unit is further widened toward the low-frequency side, piano tones and the like at the bass tone side sound like confined tones and become different from actual tones. For this reason, fundamental wave components are reduced or removed in the sound source to adjust sound quality.

Figure 12:
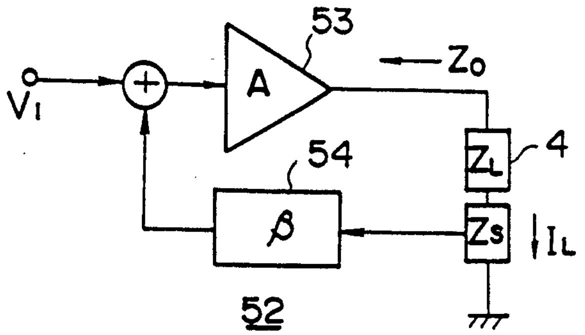
FIGS. 12 and 13 are circuit diagrams respectively showing fundamental circuits for generating negative impedance.

FIG. 12 shows the basic arrangement of a negative impedance generator 52 for driving a vibrator (speaker unit) by negative impedance.

In the circuit shown in the Figure, an output from an amplifier 53 having a gain A is supplied to a load $Z_L$ constituted by a speaker system A current $I_L$ flowing through the load $Z_L$ is detected, and the detected current is positively fed back to the amplifier 53 through a feedback circuit 54 having a transmission gain $\beta$. Thus, the output impedance $Z_0$ of the circuit is given by:

$$Z_0=Z_S(1-A\beta) \quad \ldots (4)$$

From equation (4), If $A>1$, $Z_0$ is an open stable type negative impedance. In the equation, $Z_S$ is the impedance of a sensor for detecting the current.

Therefore, in the circuit shown in FIG. 12, the type of impedance $Z_S$ is appropriately selected, so that the output impedance can include a desired negative impedance component. For example, when the current $I_L$ is detected by a voltage across the two end of the impedance $Z_S$, if the impedance $Z_S$ is a resistance $R_S$, the negative impedance component is a negative resistance component; if the impedance $Z_S$ is an inductance $L_S$, the negative impedance component is a negative inductance component; and if the impedance $Z_S$ is a capacitance $C_S$, the negative impedance component is a negative capacitance component. An integrator is used as the feedback circuit 54, and a voltage across the two end of the inductance $L_S$ as the impedance $Z_S$ is detected by integration, so that the negative impedance component can be a negative resistance component. A differentiator is used as the feedback circuit 54, and a voltage across the two end of the capacitance $C_S$ as the impedance $Z_S$ is detected by differentiation, so that the negative impedance component can be a negative resistance component. As the current detection sensor, a current probe such as a C.T. (current transformer) or a Hall Element can be used in place of, or in addition to these impedance element $R_S$, $L_S$ and $C_S$.

An embodiment of the above-mentioned circuit is described in, e.g., Japanese Patent Publication No. Sho 59-51771.

Figure 13:
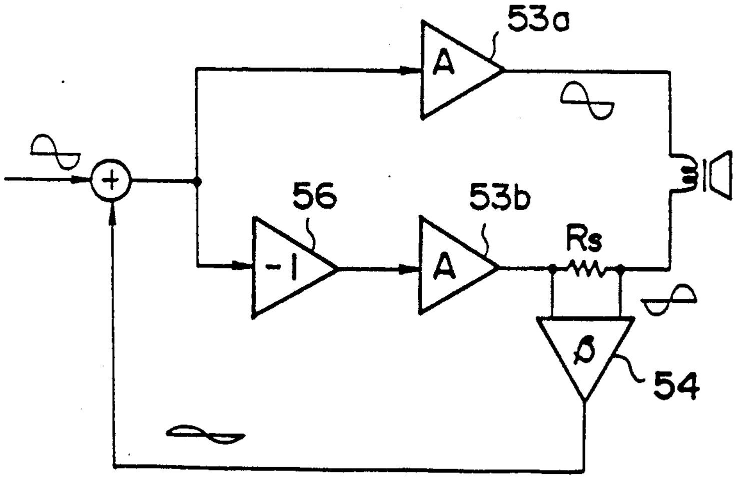

Current detection can be performed at a nonground side of the speaker 3. An embodiment of such a circuit is described in, e.g., Japanese Patent Publication No. Sho 54-33704. FIG. 13 shows a BTL connection. This can be easily applied to the circuit shown in FIG. 12. In FIG. 13, reference numeral 56 denotes an inverter.

Figure 14:
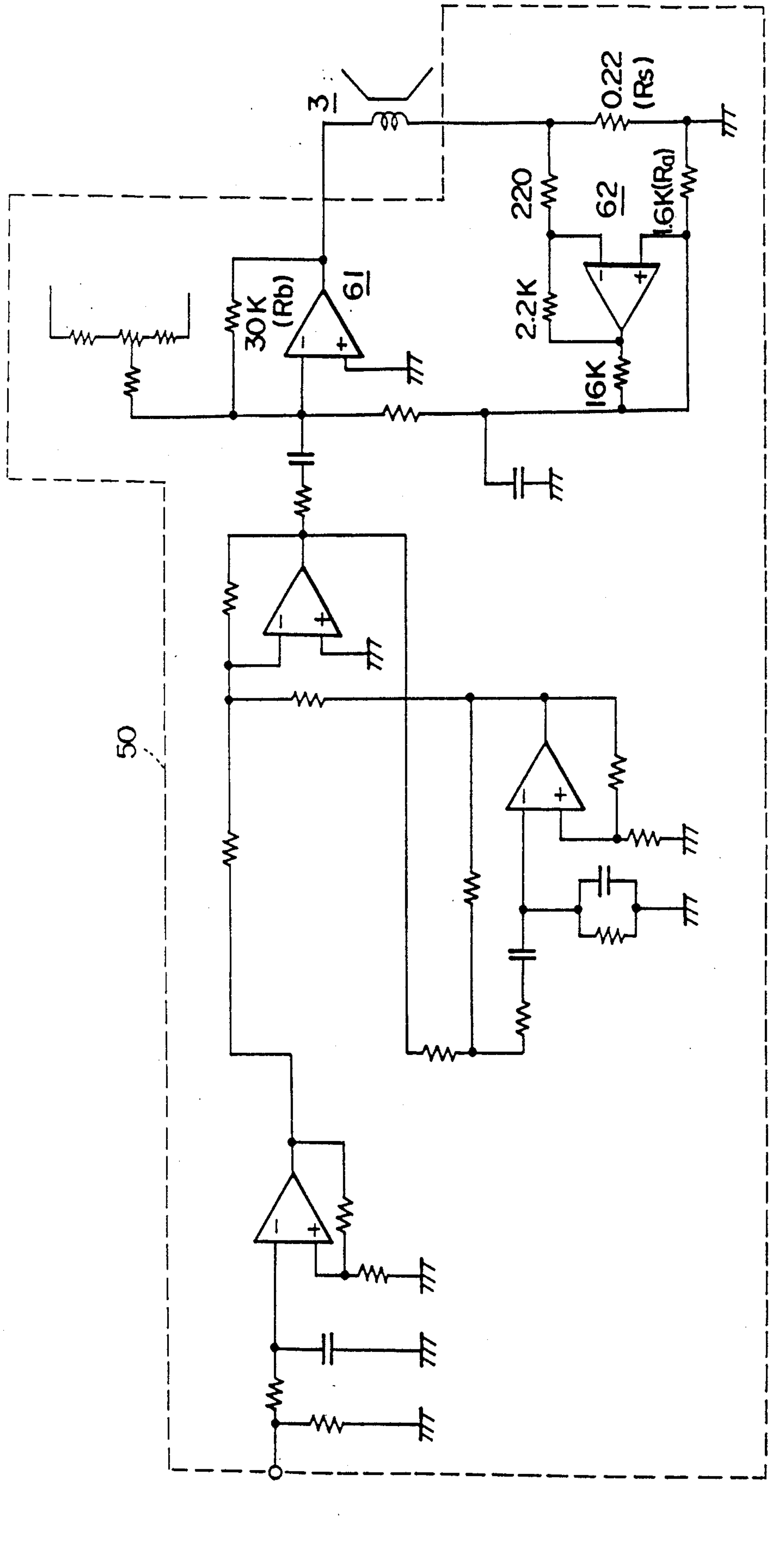
FIG. 14 is a circuit diagram showing a detailed arrangement of a negative resistance driver.

FIG. 14 shows a detailed circuit of amplifiers which include a negative resistance component in its output impedance.

The output impedance $Z_0$ in the amplifier shown in FIG. 14 is given by:

$$
\begin{aligned}
Z_0 &= R_S(1 - R_b/R_a) \\
&= 0.22(1 - 30/1.6) \\
&= -3.9\ (\Omega)
\end{aligned}
$$

(Modification of the Embodiment)

The present invention is not limited to the abovedescribed embodiments, but can be variously modified.

For example, since the second embodiment is designed to improve the low-frequency characteristics of a speaker system, only portions corresponding to the low-frequency speaker unit 15A and its driver of the first embodiment are described. However, the highfrequency speaker unit 15B can be arranged as needed.

In the second embodiment, as the above-described driver, any circuit capable of driving the vibrating body so as to cancel a counteraction from its surroundings during a drive period of the resonator can be used. For example, a so-called MFB circuit disclosed in Japanese Patent Publication (Kokoku) No. Sho 58-31156 may be used in addition to the negative impedance generator.

By setting proper frequency characteristics for the above output impedance, the freedom of setting the $Q_{oc}'$, and $Q_{op}$, and the like can be increased, characteristics, especially output sound pressure characteristics near the resonance frequencies $f_{oc}$ and $f_{op}$ can be adjusted, or an increase in distortion due to nonlinearity of a voice coil inductance component can be suppressed in a high-frequency range.

Figure 15A:
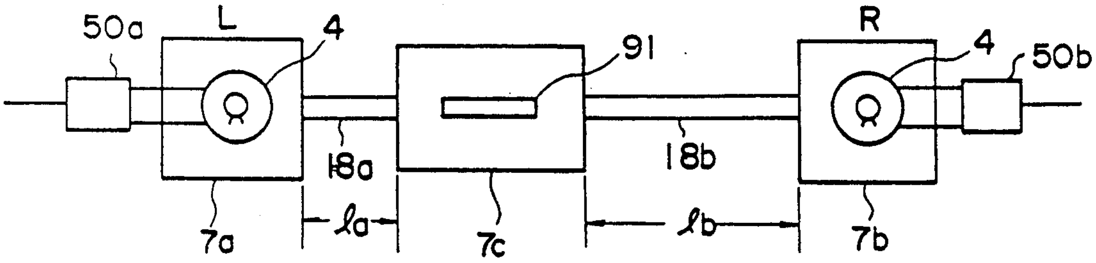
FIGS. 15(*a*), 15(*b*), 15(*c*) are views showing an arrangement of a 3D system according to another embodiment of the present invention.
Figure 15B:
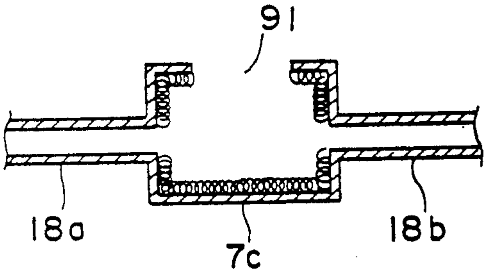
Figure 15C:
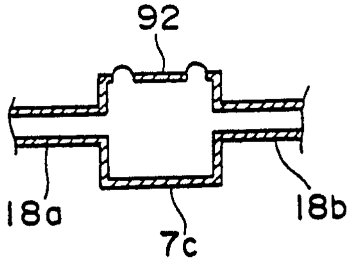
Figure 16:
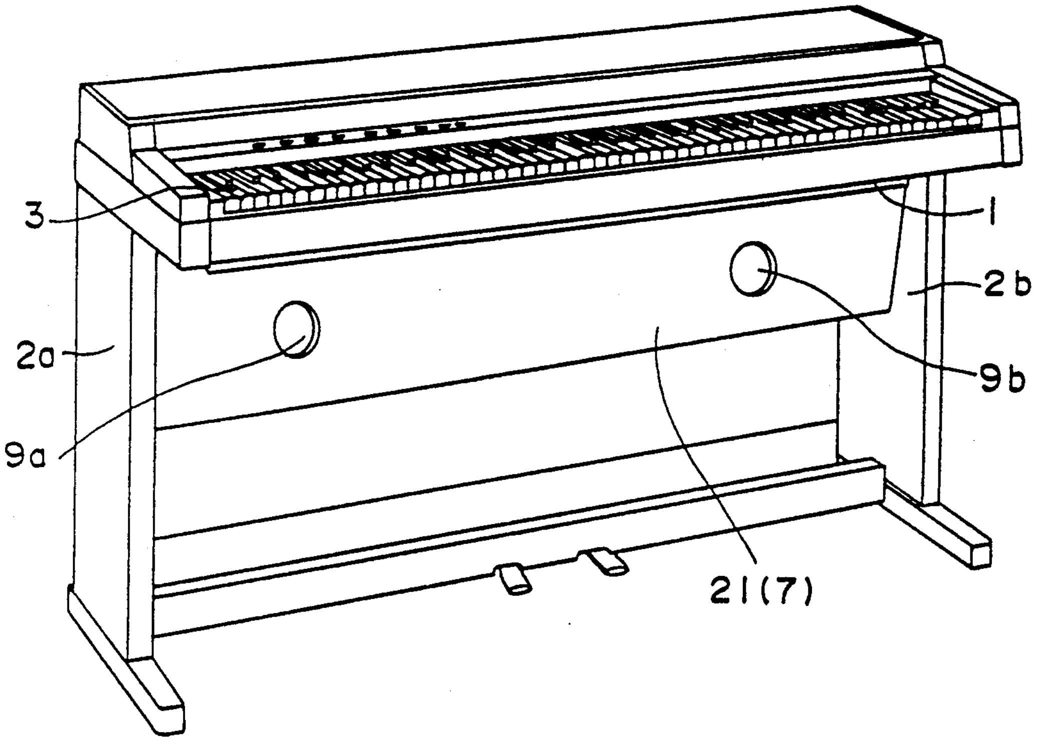
FIG. 16 is a perspective view showing an outer appearance of a keyboard instrument incorporating a sound system for constant-voltage driving a conventional bass-reflex type speaker system.

In addition, duct resonance tones may be removed by outputting an output from the resonance port through a mechanical acoustic filter. In this case, as shown in FIG. 15(*a*), a so-called 3D (three-dimensional) system may be constituted by commonly using a single filter for the right and left channels. In this case, by setting the lengths of the left and right resonance ports 18*a* and 18*b* to be different from each other, different resonance frequencies can be set for the left and right channels, respectively. As a mechanical filter, any one of bandpass, band eliminate, and lowpass filters or a filter having any structure may be used as long as it can filter port resonance tones to eliminate duct resonance tones. For example, filters shown in FIGS. 15(*b*) and 15(*c*) may be used. FIG. 15(*b*) shows a filter obtained by forming an opening 91 in a cabinet 7*c*, which serves as a low-pass filter for passing only components of frequencies below duct resonance tones. FIG. 15(*c*) shows a filter obtained by providing a passive vibrating body 92 such as a drawn cone for a cabinet 7*c*, which serves as a band-pass filter for passing only components of frequencies in a band including port resonance tones. The resonance ports 18*a* and 18*b* having volumes shown in FIG. 6 or 7 may be stored in the cabinet 7*a*, 7*b*, or 7*c*. In this case, the overall system can be further reduced in size.

(Effects)

As has been described above, according to the first aspect, a performer can directly and clearly grasp performance tones. In addition, peripheral units and the like can be placed on the upper surface of the case of an instrument.

Since a large-diameter speaker unit for middle and bass tones is arranged to be more inclined than a small-diameter unit for treble tones, a demand for a low-profile main body case can be fully satisfied. In this case, since degradation in sound quality of middle and bass tones is less influential than that of treble tones, performance tones remain substantially the same for a performer.

According to the second aspect, a cabinet of a speaker unit can be reduced in size, and operability and freedom of design of a keyboard can be increased without impairing reproduction low-frequency characteristics. In addition, the reproduction lowfrequency characteristics can be improved without increasing the size of a cabinet.

According to the third aspect of the present invention, since at least part of the inner wall of a cabinet is constituted by a damping material for preventing duct resonance, even if the profile of the cabinet is decreased in association with an arrangement, design, and the like of the cabinet, noise due to duct resonance or an increase in distortion can be prevented.

According to the fourth aspect of the present invention, since a low-frequency range is shared by a plurality of sets of speaker systems in units of bands, each speaker system can be efficiently operated. Therefore, the capacity of a driving means can be decreased, or an increase in capacity thereof can be suppressed.

What is claimed:

1. A keyboard instrument comprising:

a box-like main body case;

a keyboard arranged on a front side of said main body case;

a slit formed in said main body case so as to be open to the front side; and a speaker unit arranged upright in said main body case on a rear side of said keyboard and having a diaphragm whose axis is directed to said tone escape, wherein said speaker unit includes large- and small-diameter speakers, an inclination of said large-diameter speaker being smaller than that of said small-diameter speaker.

* * * * *